(12) United States Patent
Lutz, Jr.

(10) Patent No.: US 6,181,572 B1
(45) Date of Patent: Jan. 30, 2001

(54) DIGITAL SUBSCRIBER LINE (XDSL) MODEM HAVING A MULTI-LAYER ELECTROMAGNETIC SHIELD AND METHOD OF MANUFACTURE

(75) Inventor: Ronald D. Lutz, Jr., Round Rock, TX (US)

(73) Assignee: Cisco Technology, Inc., San Jose, CA (US)

(*) Notice: Under 35 U.S.C. 154(b), the term of this patent shall be extended for 0 days.

(21) Appl. No.: 09/100,668

(22) Filed: Jun. 19, 1998

(51) Int. Cl.⁷ .................................................. H05K 9/00
(52) U.S. Cl. .................... 361/800; 361/728; 361/752; 361/816; 174/35 R; 174/35 MS
(58) Field of Search .................................. 361/728, 736, 361/737, 752, 753, 796, 799, 800, 816, 818; 174/35 R, 35 GC, 51, 35 MS; 206/719, 721

(56) References Cited

U.S. PATENT DOCUMENTS

| | | | |
|---|---|---|---|
| 3,532,827 | 10/1970 | Ewin | 179/18 |
| 3,821,484 | 6/1974 | Sternung et al. | 179/18 EB |
| 4,002,849 | 1/1977 | Kotler et al. | 179/18 EB |
| 4,282,408 | 8/1981 | Stauers | 179/18 FA |
| 4,438,511 | 3/1984 | Baran | 370/19 |
| 4,665,514 | 5/1987 | Ching et al. | 370/60 |
| 4,670,347 * | 6/1987 | Lasik et al. | 174/35 MS |
| 4,679,227 | 7/1987 | Hughes-Hartogs | 379/98 |
| 4,723,267 | 2/1988 | Jones et al. | 379/93 |
| 4,731,816 | 3/1988 | Hughes-Hartogs | 379/98 |
| 4,757,495 | 7/1988 | Decker et al. | 370/76 |
| 4,782,512 | 11/1988 | Hutton | 379/98 |
| 4,833,706 | 5/1989 | Hughes-Hartogs | 379/98 |
| 4,841,561 | 6/1989 | Hill | 379/97 |
| 4,949,355 | 8/1990 | Dyke et al. | 375/10 |
| 4,980,897 | 12/1990 | Decker et al. | 375/38 |
| 5,005,106 * | 4/1991 | Kiku | 361/818 |
| 5,025,469 | 6/1991 | Bingham | 379/98 |
| 5,054,034 | 10/1991 | Hughes-Hartogs | 375/8 |
| 5,119,402 | 6/1992 | Ginzburg et al. | 375/17 |
| 5,134,611 | 7/1992 | Steinka et al. | 370/79 |
| 5,185,763 | 2/1993 | Krishnan | 375/39 |
| 5,198,818 | 3/1993 | Samueli et al. | 341/144 |
| 5,199,071 | 3/1993 | Abe et al. | 379/38 |
| 5,202,884 | 4/1993 | Close et al. | 370/94.1 |
| 5,206,886 | 4/1993 | Bingham | 375/97 |
| 5,214,650 | 5/1993 | Renner et al. | 370/110.1 |

(List continued on next page.)

FOREIGN PATENT DOCUMENTS

| | | |
|---|---|---|
| 62-084646 | 4/1987 | (JP) . |
| 62-222755 | 9/1987 | (JP) . |
| 63-76648 | 4/1988 | (JP) . |
| 02271763 | 11/1990 | (JP) . |
| 04100367 | 4/1992 | (JP) . |
| WO 86/02796 | 5/1986 | (WO) . |
| WO 97/37458 | 10/1997 | (WO) . |

OTHER PUBLICATIONS

Horst Hessenmüller, et al., Zugangsnetzstrukturen für interaktive Videodienste (Teil 1), *Fernmelde Ingenieur, Der*, vol. 48, No. 8, XP000647017, Aug., 1994, Germany, pp. 1–32 (with English translation).

Horst Hessenmüller, et al., Zugangsnetzstrukturen für interaktive Videodienste (Teil 2), *Fernmelde–Ingenieur*, vol. 48, No. 9, XP000619688, Sep., 1994, Germany, pp. 1–28 (with English translation).

*Primary Examiner*—Jayprakash N. Gandhi
(74) *Attorney, Agent, or Firm*—Baker Botts L.L.P.

(57) ABSTRACT

An xDSL modem assembly is provided. The assembly comprises a housing, a circuit board having xDSL electronics, and a multi-layer electromagnetic shield formed to receive the circuit board. The circuit board is positioned inside the multi-layer electromagnetic shield, and the multi-layer electromagnetic shield is positioned inside the housing.

3 Claims, 1 Drawing Sheet

U.S. PATENT DOCUMENTS

| | | | |
|---|---|---|---|
| 5,222,077 | 6/1993 | Krishnan | 375/39 |
| 5,228,062 | 7/1993 | Bingham | 375/97 |
| 5,247,347 | 9/1993 | Litteral et al. | 358/85 |
| 5,282,155 | 1/1994 | Jones | 364/724.19 |
| 5,285,474 | 2/1994 | Chow et al. | 375/13 |
| 5,293,402 | 3/1994 | Crespo et al. | 375/14 |
| 5,295,159 | 3/1994 | Kerpez | 375/38 |
| 5,331,670 | 7/1994 | Sorbara et al. | 375/111 |
| 5,337,348 | 8/1994 | Yamazaki et al. | 379/94 |
| 5,339,355 | 8/1994 | Mori et al. | 379/94 |
| 5,341,474 | 8/1994 | Gelman et al. | 395/200 |
| 5,345,437 | 9/1994 | Ogawa | 370/13 |
| 5,367,540 | 11/1994 | Kakuishi et al. | 375/103 |
| 5,371,532 | 12/1994 | Gelman et al. | 348/7 |
| 5,379,441 | 1/1995 | Watanabe et al. | 395/800 |
| 5,390,239 | 2/1995 | Morris et al. | 379/93 |
| 5,400,322 | 3/1995 | Hunt et al. | 370/19 |
| 5,404,388 | 4/1995 | Eu | 379/24 |
| 5,408,260 | 4/1995 | Arnon | 348/6 |
| 5,408,522 | 4/1995 | Ikehata et al. | 379/98 |
| 5,408,614 | 4/1995 | Thornton et al. | 395/275 |
| 5,410,264 | 4/1995 | Lechleider | 327/311 |
| 5,410,343 | 4/1995 | Coddington et al. | 348/7 |
| 5,414,455 | 5/1995 | Hooper et al. | 348/7 |
| 5,414,733 | 5/1995 | Turner | 375/233 |
| 5,422,876 | 6/1995 | Turudic | 370/15 |
| 5,428,608 | 6/1995 | Freeman et al. | 370/60.1 |
| 5,430,793 | 7/1995 | Ueltzen et al. | 379/93 |
| 5,436,803 * | 7/1995 | Annis et al. | 361/818 |
| 5,440,335 | 8/1995 | Beveridge | 348/13 |
| 5,442,390 | 8/1995 | Hooper et al. | 348/7 |
| 5,453,779 | 9/1995 | Dan et al. | 348/7 |
| 5,461,415 | 10/1995 | Wolf et al. | 348/7 |
| 5,461,616 | 10/1995 | Suzuki | 370/79 |
| 5,461,640 | 10/1995 | Gatherer | 375/231 |
| 5,469,495 | 11/1995 | Beveridge | 379/56 |
| 5,475,735 | 12/1995 | Williams et al. | 379/59 |
| 5,477,263 | 12/1995 | O'Callaghan et al. | 348/7 |
| 5,479,447 | 12/1995 | Chow et al. | 375/260 |
| 5,485,672 * | 1/1996 | Carpenter et al. | 174/35 R |
| 5,495,483 | 2/1996 | Grube et al. | 370/95.1 |
| 5,504,736 | 4/1996 | Cubbison, Jr. | 370/13 |
| 5,504,753 | 4/1996 | Renger et al. | 371/20.1 |
| 5,506,868 | 4/1996 | Cox et al. | 375/222 |
| 5,513,251 | 4/1996 | Rochkind et al. | 379/93 |
| 5,528,585 | 6/1996 | Cooley et al. | 370/56 |
| 5,536,905 * | 7/1996 | Redman et al. | 174/35 GC |
| 5,544,008 * | 8/1996 | Dimmick et al. | 361/684 |
| 5,546,379 | 8/1996 | Thaweethai et al. | 370/17 |
| 5,555,244 | 9/1996 | Gupta et al. | 370/60.1 |
| 5,574,724 | 11/1996 | Bales et al. | 370/68.1 |
| 5,583,872 | 12/1996 | Albrecht et al. | 370/476 |
| 5,598,406 | 1/1997 | Albrecht et al. | 370/296 |
| 5,600,712 | 2/1997 | Hanson et al. | 379/142 |
| 5,602,902 | 2/1997 | Satterlund et al. | 379/59 |
| 5,621,363 * | 4/1997 | Ogden et al. | 361/818 |
| 5,631,897 | 5/1997 | Pacheco et al. | 370/237 |
| 5,632,021 | 5/1997 | Jennings et al. | 395/309 |
| 5,649,001 | 7/1997 | Thomas et al. | 379/93.07 |
| 5,668,857 | 9/1997 | McHale | 379/93.07 |
| 5,678,004 | 10/1997 | Thaweethai | 595/187.01 |
| 5,687,176 | 11/1997 | Wisniewski et al. | 370/476 |
| 5,698,818 * | 12/1997 | Brench | 174/35 R |
| 5,737,364 | 4/1998 | Cohen et al. | 375/220 |
| 5,751,710 | 5/1998 | Crowther et al. | 370/423 |
| 5,756,280 | 5/1998 | Soora et al. | 455/4.2 |
| 5,770,950 | 6/1998 | Zurcher et al. | 326/30 |
| 5,781,617 | 7/1998 | McHale et al. | 379/93.14 |
| 5,793,987 | 8/1998 | Quackenbush et al. | 395/280 |
| 5,796,578 * | 8/1998 | Jones | 361/681 X |
| 5,799,017 | 8/1998 | Gupta et al. | 370/419 |
| 5,812,786 | 9/1998 | Seazholtz et al. | 395/200.63 |
| 5,852,655 | 12/1998 | McHale et al. | 379/93.14 |
| 5,981,103 * | 11/1999 | Batten, Jr. et al. | 429/163 |

* cited by examiner

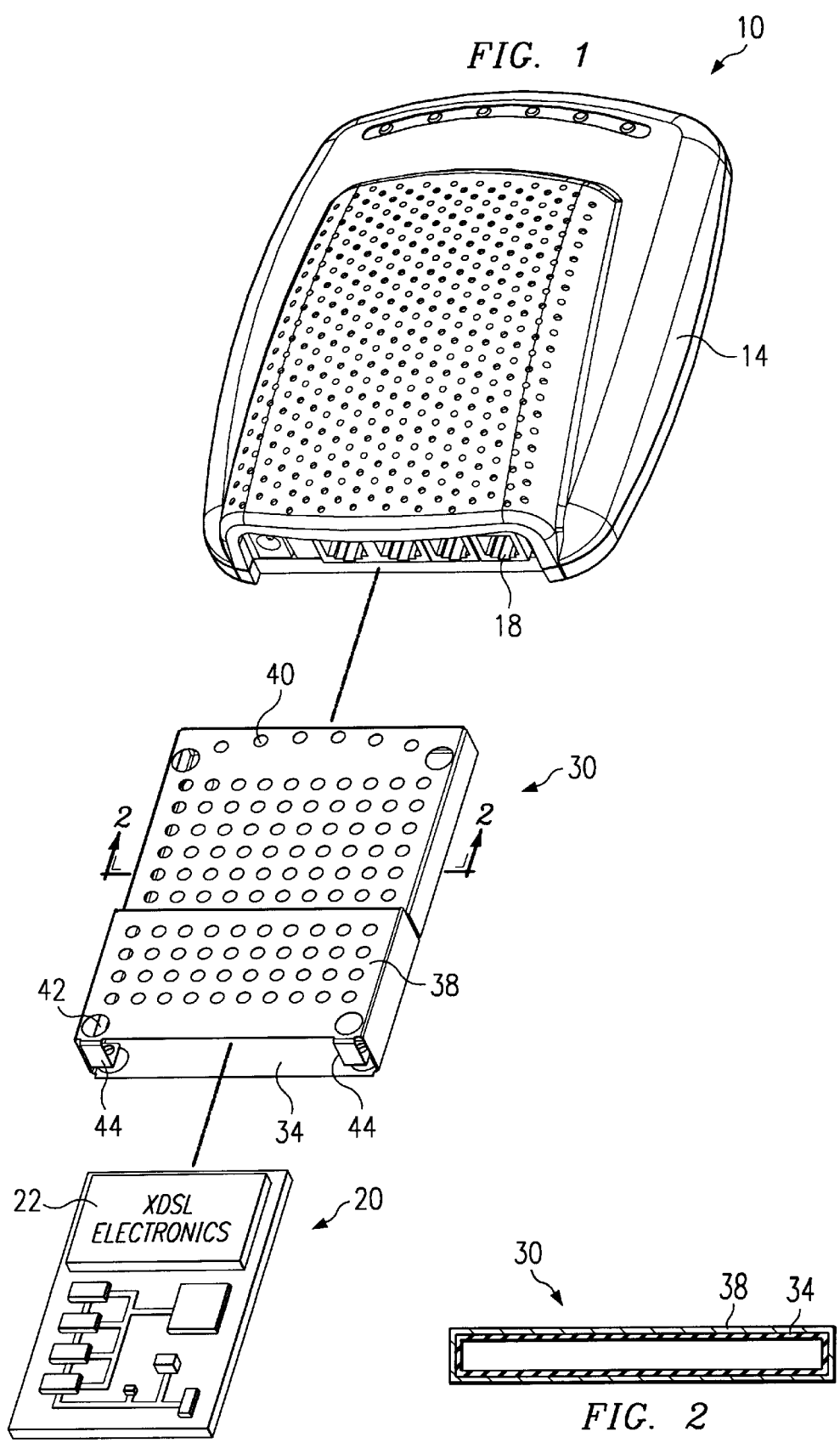

… (US 6,181,572 B1) …

DIGITAL SUBSCRIBER LINE (XDSL) MODEM HAVING A MULTI-LAYER ELECTROMAGNETIC SHIELD AND METHOD OF MANUFACTURE

TECHNICAL FIELD OF THE INVENTION

The present invention relates generally to the field of digital subscriber line (xDSL) modems and, more particularly, to a digital subscriber line (xDSL) modem having a multi-layer electromagnetic shield and method of manufacture.

BACKGROUND OF THE INVENTION

Digital Subscriber Line (xDSL) modems provide the ability to transmit data at high rates across twisted pair telephone wiring. The electronic circuitry and frequencies required to accomplish this task can generate substantial electromagnetic (EM) radiation. Such EM radiation can be problematic because a device that exhibits high EM radiation can fail to satisfy United States Federal Communications Commission (FCC) requirements for electronic devices. Furthermore, high EM radiation can interfere with the operation of other electronic equipment.

Some conventional xDSL modems address the EM radiation problem by forming the housing for the xDSL circuitry out of a relatively thick conductive material, such as cast metal. Typically, such systems are effective in sufficiently curbing the EM radiation. However, for some applications, it is desirable to create the modem housing out of composite, plastic, or other non-conductive material. For example, such housings may be used to create light-weight, less expensive devices for the mass market. Such a composite or plastic housing is generally ineffective in preventing EM radiation.

One conventional method for blocking EM radiation is to use a metal spray coating, for example a copper spray coating, applied to the inner surface of the composite or plastic housing. Such coatings are helpful but can sometimes fail to sufficiently reduce the EM radiation. Furthermore, the metal spray coating can be a time consuming and expensive process step.

SUMMARY OF THE INVENTION

In accordance with the present invention, a digital subscriber line (xDSL) modem having a multi-layer electromagnetic shield and method of manufacture are disclosed that provide significant advantages over prior developed EM shielding methods for xDSL modems.

An xDSL modem assembly is provided that includes a housing and a circuit board having xDSL electronics. A multi-layer electromagnetic shield is formed to receive the circuit board. The circuit board is positioned inside the multi-layer electromagnetic shield, and the multi-layer electromagnetic shield is positioned inside the housing.

It is a technical advantage of the present invention that EM radiation from an xDSL modem can be substantially reduced at a low per unit cost and with a relatively simple manufacturing step. In particular, EM radiation from an xDSL modem having a composite, plastic, or other non-conductive housing can be reduced using the multi-layer electromagnetic shield. This reduction can, for example, be approximately 30 dB.

Other technical advantages should be apparent to one of ordinary skill in the art in view of the specification, claims, and drawings.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein:

FIG. 1 is an exploded view of one embodiment of an external xDSL modem having a multi-layer electromagnetic shield according to the present invention; and FIG. 2 is a cross sectional view of one embodiment of a multi-layer electromagnetic shield according to the present invention.

DETAILED DESCRIPTION OF THE INVENTION

FIG. 1 is an exploded view of one embodiment of an external xDSL modem, indicated generally at 10, having a multi-layer shield according to the present invention. xDSL modem 10 comprises a housing 14, at least one port 18, and circuit board 20. Circuit board 20 can include the necessary xDSL electronics 22, such as an xDSL chip set, for the operation of xDSL modem 10. Ports 18 can be used to connect an electronic device, such as a computer, to xDSL modem 10. Ports 18 can also be used to connect xDSL modem 10 to a premises network, for example a telephone line or other network connection.

Housing 14 can be made of a number of suitable materials. However, if housing 14 is made from a non-conductive material, such as composite material or plastic material, the EM radiation generated by the electronics on circuit board 20 can be excessive unless some form of shielding is used. Even if housing 14 is partially conductive or provided with a conductive surface, the EM radiation escaping housing 14 can be problematic.

A multi-layer electromagnetic shield 30, according to the present invention, can be positioned inside housing 14 and formed to receive circuit board 20. In one embodiment, shield 30 is constructed from a multi-layer material comprising an insulating layer 34 and a conductive layer 38. This layer structure is shown in more detail, for example, in FIG. 2. Insulating layer 34 can be made of an insulating and/or fire retardant material such as polycarbon. Conductive layer 38 can be made of a conducting material such as aluminum. Shield 30 can further include holes 40 formed in shield 30 to allow heat transfer from circuit board 20. Shield 30 can include screw holes 42 which are operable to receive screws to couple shield 30 to circuit board 20. In one implementation, the total width of insulating layer 34 and conductive layer 38 is approximately 0.01 inches (0.25 mm). One example such a multi-layer material is LEXAN POLYCARBONATE with aluminum foil.

As shown in FIG. 1, shield 30 surrounds circuit board 20, substantially forming a rectangular parallelpiped having a base, a top, and three vertical sides, with a hole on the fourth vertical side for inserting circuit board 20. Two vertical tabs 44 on the fourth side, disposed at either vertical edge, define the hole to correspond to the size of ports 18. In the example shown, the top of shield 30 is shaped as a two-level, stepped member, formed to correspond to an underlying shape of circuit board 20. In addition, each of vertical tabs 44 form an L-shape, with the bases of the Ls aligned with screw holes 42 in the base of shield 30.

In operation, circuit board 20 is positioned inside of shield 30. This places insulating layer 34 proximate circuit board 20 and substantially surrounds circuit board 20 with shield 30. Insulating layer 34 can protect shield 30 from heat exposure generated by circuit board 20. Conducting layer 38 serves as an electromagnetic shield and can be connected to electrical ground of circuit board 20 to enhance this function. For example, a portion of insulating layer 34 can be removed proximate screw holes 42 such that the screws will connect conducting layer 38 with electrical ground of circuit board 20. In this manner, conducting layer 38 can attenuate EM radiation from circuit board 20 and can allow an xDSL modem to more easily be made FCC compliant. Shield 30 can significantly limit EM radiation and is more effective, less costly, and more simple to implement than a spray metal coating. For example, a 0.01 inches (0.25 mm) thick multi-layer shield can reduce EM radiation by approximately 30 dB.

FIG. 2 is a cross sectional view of one embodiment of multi-layer electromagnetic shield 30 according to the present invention. In the embodiment of FIG. 2, shield 30 is viewed along the section labeled 2—2 in FIG. 1. Shield 30 comprises an insulating layer 34 coupled to a conducting layer 38. Shield 30 is formed to receive and can substantially surround a circuit board. This places insulating layer 34 proximate the circuit board and places conducting layer 38 between the circuit board and the external environment. Conducting layer 38 can then be operable to significantly attenuate EM radiation from the circuit board, as discussed above with respect to FIG. 1.

Although the present invention has been described in detail, it should be understood that various changes, substitutions and alterations can be made thereto without departing from the spirit and scope of the invention as defined by the appended claims.

What is claimed is:

1. A digital subscriber line (xDSL) modem assembly comprising:

a housing;

a circuit board having xDSL electronics; and a multi-layer electromagnetic shield formed to receive the circuit board, wherein the multi-layer electromagnetic shield is substantially shaped as a rectangular parallelepiped having a plurality of vertical sides and one at least partially open side to define a hole sized to accept a row of ports coupled to the circuit board, wherein the one at least partially open side is formed by two vertical tabs disposed at either vertical edge of the one at least partially open side, the tabs defining the hole sized to accept the row of ports;

the circuit board positioned inside the multi-layer electromagnetic shield, and the multi-layer electromagnetic shield positioned inside the housing, wherein the multi-layer electromagnetic shield and the row of ports form a surface substantially surrounding the circuit board.

2. A digital subscriber line (xDSL) modem assembly comprising:

a housing;

a circuit board having xDSL electronics; and a multi-layer electromagnetic shield formed to receive the circuit board, wherein the multi-layer electromagnetic shield is substantially shaped as a rectangular parallelepiped having a plurality of vertical sides and one at least partially open side to define a hole sized to accept a row of ports coupled to the circuit board, wherein the one at least partially open side is formed by two vertical tabs disposed at either vertical edge of the one at least partially open side, the tabs defining the hole sized to accept the row of ports;

the multi-layer electromagnetic shield comprising:

an insulating layer made of polycarbon; and a conductive layer made of aluminum coupled to the insulating layer to form a multi-layer material;

the circuit board positioned inside the multi-layer electromagnetic shield, and the multi-layer electromagnetic shield positioned inside the housing, wherein the multi-layer electromagnetic shield and the row of ports form a surface substantially surrounding the circuit board.

3. A method of manufacturing a digital subscriber line (xDSL) modem assembly comprising:

providing a housing;

providing a circuit board having xDSL electronics;

providing a multi-layer electromagnetic shield, wherein the multi-layer electromagnetic shield is substantially shaped as a rectangular parallelepiped having a plurality of vertical sides and one at least partially open side to define a hole sized to accept a row of ports coupled to the circuit board, wherein the one at least partially open side is formed by two vertical tabs disposed at either vertical edge of the one at least partially open side, the tabs defining the hole sized to accept the row of ports;

positioning the circuit board inside the multi-layer electromagnetic shield to align the row of ports within the hole; and positioning the multi-layer shield and the circuit board inside the housing, wherein the multi-layer electromagnetic shield and the row of ports form a surface substantially surrounding the circuit board.

* * * * *